(12) United States Patent
Teranishi et al.

(10) Patent No.: US 10,928,420 B2
(45) Date of Patent: Feb. 23, 2021

(54) PROBE PIN AND INSPECTION UNIT

(71) Applicant: Omron Corporation, Kyoto (JP)

(72) Inventors: Hirotada Teranishi, Kyoto (JP); Takahiro Sakai, Kyoto (JP)

(73) Assignee: Omron Corporation, Kyoto (JP)

( * ) Notice: Subject to any disclaimer, the term of this patent is extended or adjusted under 35 U.S.C. 154(b) by 61 days.

(21) Appl. No.: 16/332,269

(22) PCT Filed: Aug. 18, 2017

(86) PCT No.: PCT/JP2017/029656
§ 371 (c)(1),
(2) Date: Mar. 11, 2019

(87) PCT Pub. No.: WO2018/055961
PCT Pub. Date: Mar. 29, 2018

(65) Prior Publication Data
US 2019/0361049 A1 Nov. 28, 2019

(30) Foreign Application Priority Data
Sep. 21, 2016 (JP) .............................. JP2016-184838

(51) Int. Cl.
G01R 1/067 (2006.01)
G01R 1/073 (2006.01)
(Continued)

(52) U.S. Cl.
CPC ..... *G01R 1/06738* (2013.01); *G01R 1/06716* (2013.01); *G01R 1/0735* (2013.01);
(Continued)

(58) Field of Classification Search
CPC ............ G01R 1/06738; G01R 1/06716; G01R 1/06755; G01R 1/06788; G01R 1/06722;
(Continued)

(56) References Cited

U.S. PATENT DOCUMENTS 8,926,379 B2   1/2015  Vinther
2009/0233493 A1*  9/2009  Tominaga ............ G01R 1/0416
                                                      439/733.1
(Continued)

FOREIGN PATENT DOCUMENTS

CN    101614755 A    12/2009
CN    102798741 A    11/2012
(Continued)

OTHER PUBLICATIONS

Office Action in counterpart Korean Application No. 2019-7005720 dated Feb. 10, 2020 (9 pages).
(Continued)

*Primary Examiner* — Thang X Le
(74) *Attorney, Agent, or Firm* — Osha Bergman Watanabe & Burton LLP

(57) ABSTRACT

A probe pin is provided with a plate-like movable pin including: a flexible part configured to extend and contract lengthwise; a first contact part and a second contact part each provided at an end of the flexible part lengthwise; and a conduction-path forming element overlapping the movable pin along the thickness thereof. The conduction-path forming element includes a first contact surface and a second contact surface at lengthwise ends configured to contact the first contact part and second contact part; the movable pin and the conduction-path forming element are arranged to allow the first contact part to remain in contact with the first contact surface and the second contact part to remain in contact with the second contact surface while allowing relative movement of the movable pin and the conduction-path forming element lengthwise.

2 Claims, 21 Drawing Sheets

(51) Int. Cl.
  *G01R 31/28* (2006.01)
  *H01R 13/24* (2006.01)
  *H01R 33/76* (2006.01)

(52) U.S. Cl.
  CPC ..... *G01R 1/07314* (2013.01); *G01R 31/2886* (2013.01); *H01R 13/24* (2013.01); *H01R 33/76* (2013.01)

(58) Field of Classification Search
  CPC ............ G01R 1/06711; G01R 1/07314; G01R 1/07342; G01R 1/07307; G01R 1/07378; G01R 1/07357; G01R 31/2886; G01R 31/3627; G01R 31/3682; G01R 31/3696; G01R 31/2831
  See application file for complete search history.

(56) References Cited

U.S. PATENT DOCUMENTS

| | | | | |
|---|---|---|---|---|
| 2010/0285698 | A1* | 11/2010 | Lee | G01R 1/06722 439/786 |
| 2012/0299612 | A1 | 11/2012 | Lee et al. | |
| 2013/0247375 | A1* | 9/2013 | Sato | H05K 13/00 29/874 |
| 2014/0065893 | A1* | 3/2014 | Vinther | H01R 4/48 439/817 |
| 2014/0218062 | A1 | 8/2014 | Sakai et al. | |
| 2014/0235112 | A1* | 8/2014 | Sakai | H01R 13/2428 439/824 |
| 2014/0253163 | A1* | 9/2014 | Suzuki | G01R 1/06733 324/755.05 |
| 2017/0115324 | A1 | 4/2017 | Teranishi et al. | |
| 2018/0011127 | A1* | 1/2018 | Teranishi | G01R 1/04 |

FOREIGN PATENT DOCUMENTS

| | | |
|---|---|---|
| JP | 2003-307525 A | 10/2003 |
| JP | 2015-45649 A | 3/2015 |
| JP | 2015-81805 A | 4/2015 |
| JP | 5699899 B2 | 4/2015 |
| JP | 2016-3921 A | 1/2016 |
| WO | 2013/054555 A1 | 4/2013 |

OTHER PUBLICATIONS

International Search Report issued in Application No. PCT/JP2017/029656, dated Nov. 14, 2017 (2 pages).

Written Opinion issued in International Application No. PCT/JP2017/029656, dated Nov. 14, 2017 (4 pages).

Office Action issued in corresponding Japanese Application No. 2016-184838, dated Oct. 1, 2019 (6 pages).

* cited by examiner

US 10,928,420 B2

PROBE PIN AND INSPECTION UNIT

FIELD

The present invention relates to a probe pin and an inspection unit that uses the probe pin.

BACKGROUND

The conductivity and operational characteristics of an electronic component are usually inspected while producing an electronic component such as a semiconductor element. The inspection is carried out using an inspection unit where probe pins are housed in a matrix; the inspection unit is used to connect the electrodes of a semiconductor package and an inspection device.

For instance, Japanese Patent Publication Number 5699899 describes such a probe pin. The probe pins include a fixture and a movable part that extend lengthwise and are provided independently with a gap therebetween; the probe pins also include a bellows element connecting the fixture and the movable part. A movable contact piece provided at one widthwise end of the movable part extends lengthwise along the bellows element and may contact the fixture. The movable part and the fixture can be electrically connected through the movable contact piece.

SUMMARY

Technical Problem

There have been recent demands for reducing the size of electronic component modules, the probe pins used in an inspection unit, and the pitch within an array of probe pins.

Given that a movable contact piece is provided along the width of the movable part in the aforementioned probe pin, it tends to be difficult to reduce gap widthwise between adjacent probe pins by more than a certain amount when a plurality of the aforementioned probe pins is arranged with a prescribed gap therebetween widthwise. It may also be difficult to reduce the pitch within an array of the probe pins.

Therefore, the present invention provides a probe pin that allows for reducing the pitch within an array of the probe pins and an inspection unit that uses the probe pin.

Solution to Problem

A probe pin according to a first embodiment of the present invention:

a plate-like movable pin including: a flexible part configured to expand and contract lengthwise; and a first contact part and a second contact part each provided at an end of the flexible part lengthwise; and a conduction-path forming element extending lengthwise and overlapping the movable pin along the thickness thereof and configured to electrically connect the first contact part and the second contact part to each other;

the conduction-path forming element including a first contact surface and a second contact surface at one end of the conduction-path forming element lengthwise, the first contact surface and second contact surface configured to contact the first contact part and the second contact part, respectively; wherein the movable pin and the conduction-path forming element are arranged to allow the first contact part to remain in contact with the first contact surface and the second contact part to remain in contact with the second contact surface while allowing relative movement of the movable pin and the conduction-path forming element lengthwise.

For example, the conduction-path forming element may be long, narrow plate or a rod.

An inspection unit according to the present invention includes:

the aforementioned probe pin; and a housing; the housing including a receptacle configured to store the probe pin with a portion of the first contact part and a portion of the second contact part outside the housing, and support the movable pin and the conduction-path forming element, allowing the movable pin and the conduction-path forming element to move relatively lengthwise.

Effects

A probe pin according to the aforementioned aspect is provided with a plate-like movable pin, and a conduction-path forming element overlapping the movable pin along the thickness thereof. Thus, the widthwise dimension of the movable pin determines the widthwise dimension of the probe pin; therefore, it is possible to reduce the size of the probe pin widthwise. This also makes it possible to reduce the pitch within an array of the probe pins even when a plurality of probe pins is arranged in the width direction thereof.

An inspection unit according to the present invention also makes it possible to reduce the pitch within an array of a plurality of the aforementioned probe pins.

DETAILED DESCRIPTION

Embodiments of the present invention are described below with reference to the attached drawings. Note that, while terms representing specific directions and positions (such as, terms including "up", "down", "right", "left", "side", and "end") are used in the following description, the use of these terms is merely for facilitating an understanding of the invention with reference to the drawings. The meanings of these terms are not intended to limit the technical scope of the present invention. The following description merely provides an example, and is not intended to limit the present invention, where the invention is to be adopted, or how the invention is to be used. Moreover, the drawings provided are schematic and are not intended to indicate a scale for actual measurements.

First Embodiment

Figure 1:
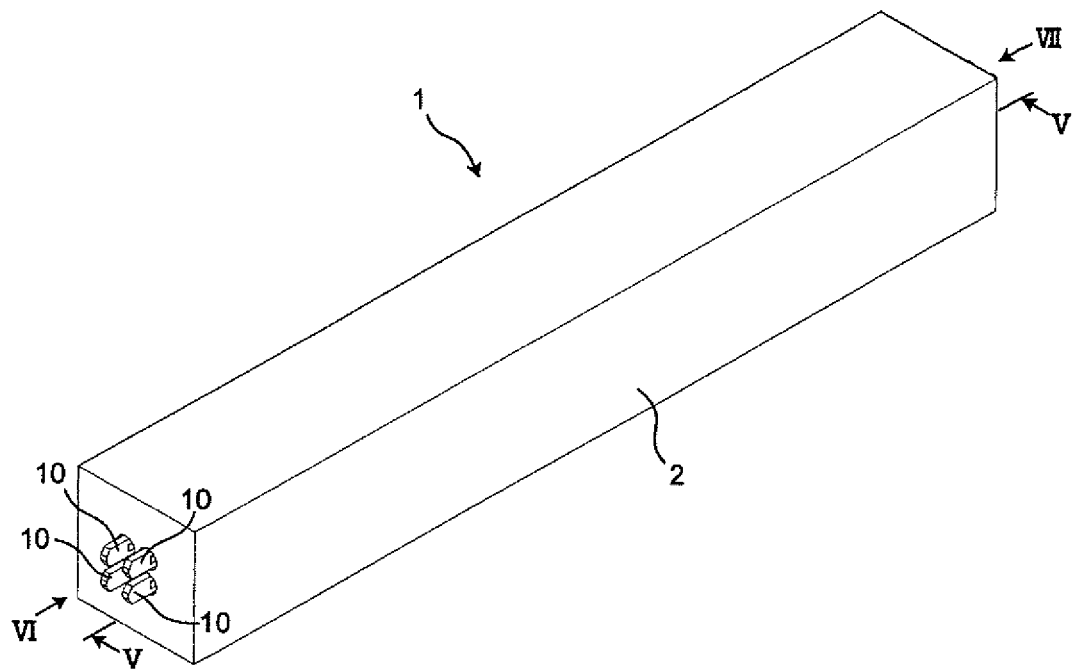
FIG. 1 is a perspective view of an inspection unit provided with a probe pin according to a first embodiment of the present invention.

A probe pin 10 according to a first embodiment of the present invention may be used while accommodated in a housing 2 as illustrated in FIG. 1; the probe pin 10 with the housing 2 constitutes an inspection unit 1. As an example, the inspection unit 1 may house four probe pins 10.

Figure 2:
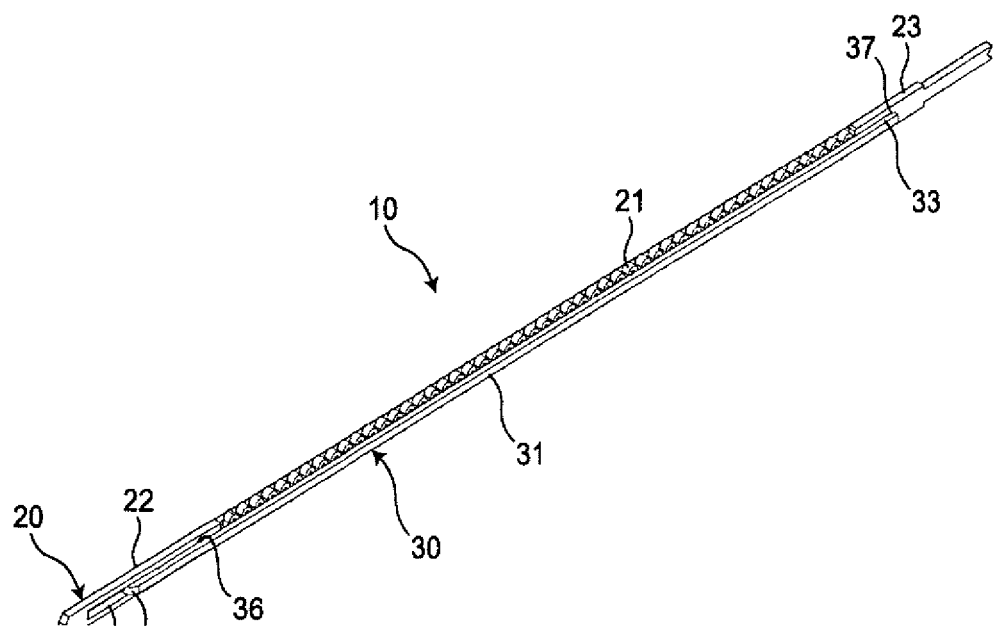
FIG. 2 is a perspective view of a probe pin according to a first embodiment of the present invention.

Each probe pin 10 is equipped with a movable pin 20 and a conduction-path forming element 30 as illustrated in FIG. 2. The movable pin 20 and the conduction-path forming element 30 are conductive and configured as thin, long, and narrow plates that may be formed via electroplating.

Figure 3:
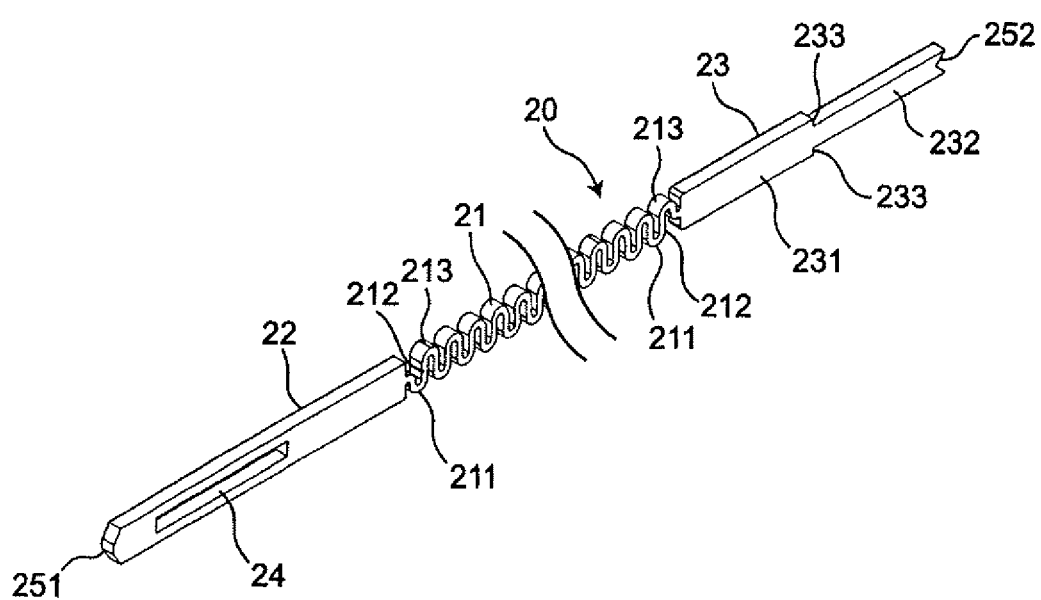
FIG. 3 is a perspective view of a movable pin in the probe pin shown in FIG. 2.

The movable pin 20 includes a flexible part 21, and a first contact part 22 and a second contact part 23 as illustrated in FIG. 3; the flexible part 21 is configured to extend and contract along the length of the movable pin 20; and the first and second contact parts 22, 23 are each provided lengthwise and in-line at an end of the flexible part 21. The movable pin 20 is symmetrical about a centerline along the width thereof. Note that in FIG. 3, a portion of the middle part of the flexible part 21 is omitted.

The flexible part 21 appears sinuous when viewing the surface thereof. The flexible part 21 is constituted by connecting a plurality of winding parts, with a single winding part configured from: a first curved part 211; a straight part 212; and a second curved part 213. The first curved part 211 protrudes downward along the width of the movable pin 20; the straight part 212 extends from one end of the first curved part 211 along the width of the movable pin 20; and the second curved part 213 protrudes upward along the width of the movable pin 20 from the end of the straight part 212 not connected to the first curved part 211. That is, the first curve part 211, the straight part 212, and the second curved part 213 are aligned repeatedly in that order lengthwise of the movable pin 20 from the widthwise center of the first contact part 22 to the widthwise center of the second contact 23.

The flexible part 21 is the same width or a narrower than the first contact part 22 and a later described width expander part 231 for the second contact part 23.

The first contact part 22 includes a rectangular plate with roughly the same widthwise dimension; the flexible part 21 is connected at one end along the length of the first contact part 22 (i.e., at the right end, FIG. 3). At the other end along the length of the first contact part 22 is a tapered first contact 251 (i.e., at the left end, FIG. 3). A long, narrow rectangular guide hole 24 is provided through the surface of the first contact part 22 in the thickness direction thereof. The guide hole 24 extends along the length of the first contact part 22 (i.e., along the length of the probe pin 10) from near the first contact 251 up to roughly the lengthwise center part of the first contact part 22.

The second contact part 23 is a roughly rectangular plate; the flexible part 21 is connected at one end along the length of the second contact part 23 (i.e., at the left end, FIG. 3). At the other end along the length of the second contact part 23 (i.e., at the right end, FIG. 3) is a second contact 252 which appears roughly V-shaped in surface view. The second contact part 23 is made up of a width expander part 231 connected to the flexible part 21, and a width reducer part 232 where the second contact 252 is provided; the width reducer part 232 has a narrower widthwise dimension than the width expander part 231. The boundary between the width expander part 231 and width reducer part 232 forms a stepped portion 233. The width expander part 231 has this roughly the same widthwise dimensions as the first contact part 22.

The conduction-path forming element 30 overlaps the movable pin 20 along the thickness thereof as illustrated in FIG. 2, and electrically connects the first contact part 22 and the second contact part 23 of the movable pin 20.

Figure 4:
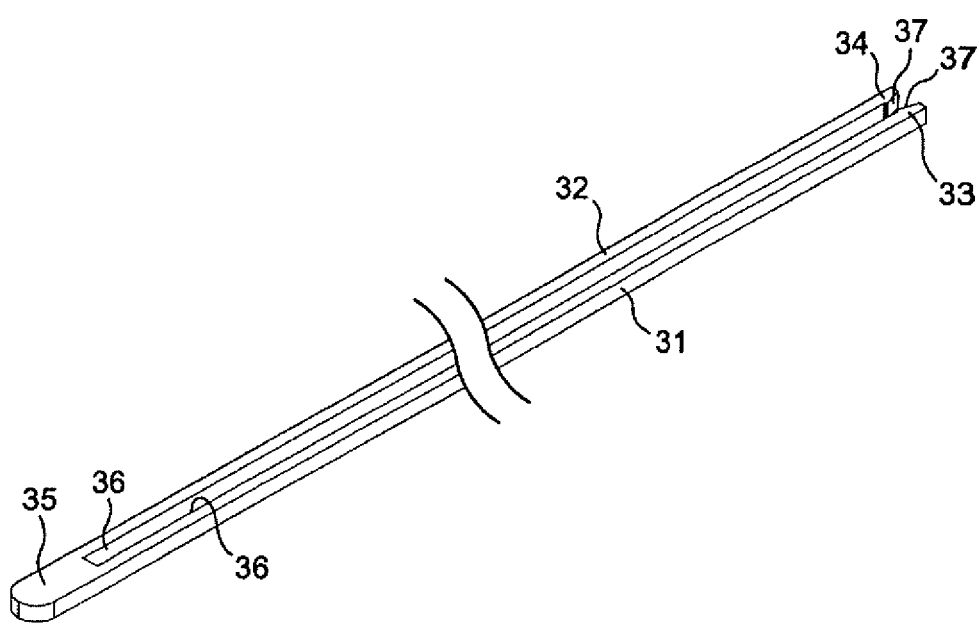
FIG. 4 is a perspective view of a conduction-path forming element in the probe pin shown in FIG. 2.
Figure 5:
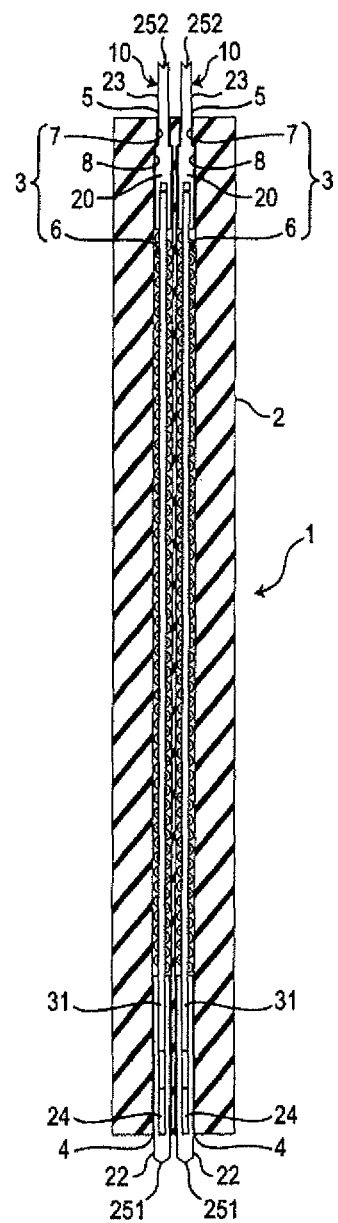
FIG. 5 is a cross-sectional view along the line V-V and FIG. 1.

More specifically, the conduction-path forming element 30 is made up of a pair of feet 31, 32 that are able to warp mutually outward as illustrated in FIG. 4. The pair of feet 31, 32 overlap different surfaces along the thickness of the movable pin 20. The conduction-path forming element 30 is symmetrical about a centerline widthwise; and, as illustrated in FIG. 5, the short side dimension of the conduction-path forming element 30 is less than the widthwise dimension of the movable pin 20 (i.e., the widthwise dimension of the flexible part 21, the first contact part 22, and the width expander part 231 for the second contact part 23) when viewed from the thickness direction of the movable pin 20. Note that in FIG. 4, a portion at the middle part of the pair of feet 31, 32 is omitted.

Figure 7:
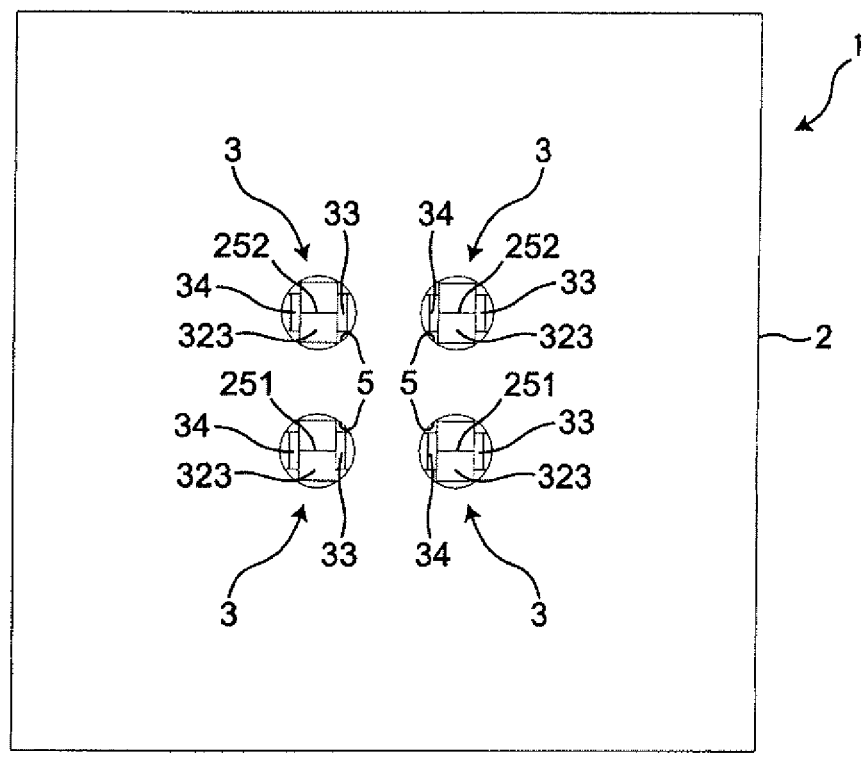
FIG. 7 is a view of the inspection unit shown in FIG. 1 along the arrow VII.

A pair of protruding portions 33, 34 are provided extending toward each other at one end (i.e. the right end, FIG. 4) respectively along the length of the pair of feet 31, 32. The pair of protruding portions 33, 34 clamps the second contact part 23 of the movable pin 20 from the thickness direction as illustrated in FIG. 7. A guide part 35 is provided at the other end along the length of the pair of feet 31, 32 (i.e., at the left end, FIG. 4). The guide part 35 connects the pair of feet 31, 32 at the other end along the length of the pair of feet 31, 32; when positioned in the guide hole 24 in the first contact part 22 of the movable pin 20, the guide part 35 can move in the extension direction of the guide hole 24 (i.e., along the length of the probe pin 10).

The mutually opposing surfaces near the guide part 35 of the pair of feet 31, 32 constitute a first contact surface 36; the first contact surface 36 touches the plate surface of the first contact part 22 of the movable pin 20 as illustrated in FIG. 2. The tip end surfaces in the extending direction of pair of protruding portions 33, 34 constitutes a second contact surface 37 (note that only the tip end surface of the protruding portion 33 is shown in FIG. 2); the second contact surface 37 touches the second contact part 23 of the movable pin 20.

That is, the structure maintains contact between the first contact part 22 of the movable pin 20 and the first contact surface of the conduction-path forming element 30, and between the second contact part 23 of the movable pin 20 and the second contact surface of the conduction-path forming element 30; at the same time, the movable pin 20 and the conduction-path forming element 30 may move relatively along the length of the probe pin 10.

An inspection unit 1 accommodating four probe pins 10 in the housing 2 is described next with reference to FIG. 1 and FIG. 5 through FIG. 7.

FIG. 1 and FIG. 4 illustrate the first contact 251 and the second contact 252 of the movable pin 20 with no force applied thereto, i.e., in a return position.

The housing 2 accommodates the probe pins 10 in four receptacles 3 as illustrated in FIG. 5 (here, only two receptacles are shown).

Figure 6:
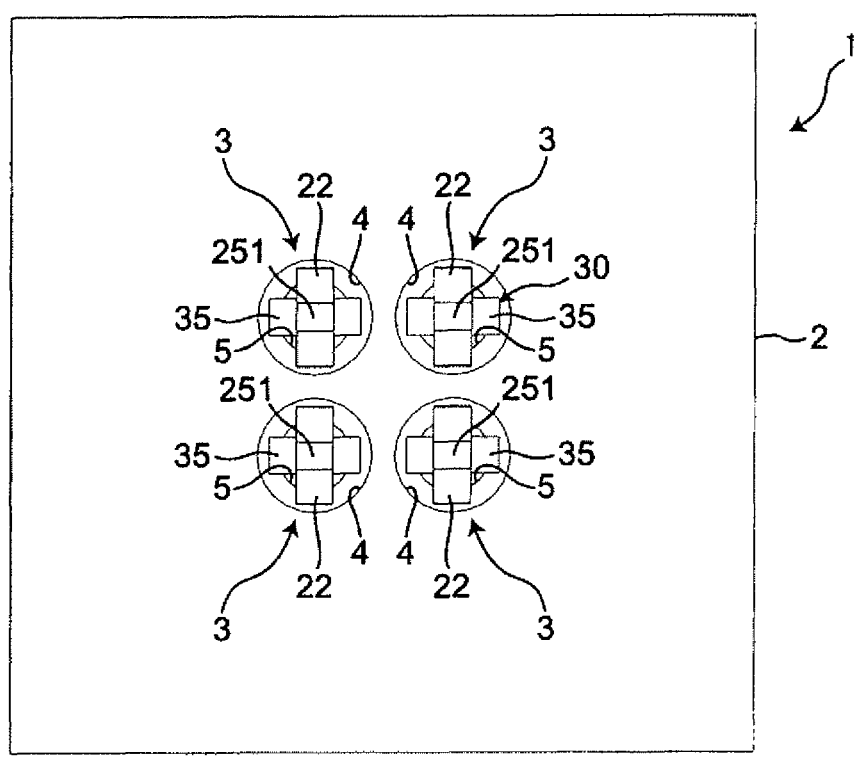
FIG. 6 is a view of the inspection unit shown in FIG. 1 along the arrow VI.

As illustrated in FIG. 1, the receptacles 3 are mutually parallel so that the receptacles 3 are positioned at the apex of a square when viewed along the arrow VI, i.e., in plan view looking from above in FIG. 5. The receptacles 3 are made up of roughly cylindrical spaces with openings 4, 5 at each end lengthwise as illustrated in FIG. 6 and FIG. 7. More specifically, the receptacles 3 are made up of a large bore 6 and a small bore 7 as illustrated in FIG. 5. The large bore 6 extends from the opening 4 at the lower end of the housing 2 to near the upper end of the housing 2 (FIG. 5); the small bore 7, which has a smaller diameter than the large bore 6, extends further upward from the large bore 6. The border between the large bore 6 on the small bore 7 forms a circular stepped portion 8.

The receptacles 3 each accommodate a single probe pin 10 with the first contact 251 and the second contact 252 each at an end of the probe pins 10 located outside the openings 4, 5 of the receptacles 3. In other words, the receptacles 3 store a single probe pin 10 with a portion of the first contact part 22 and a portion of the second contact part 23 on the movable pin 20 located outside the receptacle 3. The receptacle 3 also supports the probe pin 10 so that the movable pin 20 and the conduction-path forming element 30 may move relatively along the length of the probe pin 10.

The opening 4 of the receptacle 3 near the first contact part 22 is a circle with a diameter larger than the widthwise dimension of the movable pin 20 and the conduction-path forming element 30 as illustrated in FIG. 6. As illustrated in FIG. 7, the opening 5 of the receptacles 3 near the second contact part 22 is also a circle. The diameter of the circle is larger than the width reducer 232 of the second contact part 23 in the movable pin 20 and smaller than the width expander 231. The diameter of the circle is also smaller than the total of the dimension along the thickness of the second contact part 23 of the movable pin 20 and the dimension along the thickness of the pair of feet 31, 32 in the conduction-path forming element 30.

Additionally, the operation of the probe pins 10 accommodated in the housing 2 is described.

A force may be applied to the first contact 251 of the probe pins 10 that are in a return state (FIG. 5), pressing the first contact part 22 of the movable pin 20 into the housing 2. As a result, the stepped portion 233 of the second contact part 23 of the movable pin 20 of the probe pins makes contact with the circular stepped portion 8 in the corresponding receptacle 3. The flexible part 21 compresses until the first contact 251 of the first contact part 22 is nearly inside the receptacle 3. The probe pins 10 are now in the operation state (not shown).

At this point, the guide part 35 of the conduction-path forming element 30 moves relatively in the guide hole 24 in the first contact part 22 of the movable pin 20 and approaches the first contact 251 of the movable pin 20. This takes place while the pair of protruding portions 33, 34 clamps the second contact part 23 of the movable pin 20. That is, the movement takes place while the first contact part 22 remains in contact with the first contact surface 36 and the second contact part 23 remains in contact with the second contact surface 37.

The force applied to an inspection unit 1 in the operation state may be removed from the first contact part 22 in the movable pin 20 of the probe pins 10. When the force is removed, the compressed flexible part 21 biases the first contact part 22 toward outside the receptacle 3, and the probe pins 10 return to the return state shown in FIG. 5.

At this point, the guide part 35 of the conduction-path forming element 30 moves relatively in the guide hole 24 in the first contact part 22 of the movable pin 20 and moves away from the first contact 251 of the movable pin 20. This takes place while the pair of protruding portions 33, 34 clamps the second contact part 23 of the movable pin 20. That is, the movement takes place while the first contact part 22 remains in contact with the first contact surface 36 and the second contact part 23 remains in contact with the second contact surface 37.

A probe pin 10 according the first embodiment is provided with a plate-like movable pin 20, and a conduction-path forming element 30 overlapping the movable pin 20 along the thickness thereof. Thus, the widthwise dimension of the movable pin 20 determines the widthwise dimension of the probe pin 10; therefore, it is possible to reduce the size of the probe pin 10 widthwise. This also makes it possible to reduce the pitch within an array of the probe pins even when a plurality of probe pins 10 is arranged widthwise.

Additionally, the first contact part 22 in the movable pin 20 is also provided with a guide hole 24 extending along the length of the probe pin 10 and passing through the thickness of the movable pin 20. The conduction-path forming element 30 is also provided with a guide part 35 at the end near the first contact part 22 (i.e., near the first contact surface); the guide part 35 is positioned in the guide hole 24 and can move in the extension direction of guide hole 24. Hereby, the guide part 35 engages with the guide hole 24 and moves smoothly along in the extension direction of the guide hole 24; therefore, the movable pin 20 and the conduction-path forming element 30 may move relative each other without obstruction.

The conduction-path forming element 30 is configured from a pair of feet 31, 32 with a pair of protruding portions 33, 34 provided at one end of the conduction-path forming element 30 along the length of the probe pin 10. The pair of protruding portions 33, 34 clamps the second contact part 23 in the movable pin 20 while allowing the second contact part 23 to move. Thus, the pair of protruding portions 33, 34 ensures that contact with the second contact part 23 in the movable pin 20 remains stable while the movable pin 20 moves; this increases the contact reliability between the movable pin 20 and the conduction-path forming element 30.

Incidentally, it is easier to mold the receptacles as a substantially cylindrical space to house the probe pins in an inspection unit as an increasingly narrower pitch is desired between probe pins; here, the cross-section of the receptacle along the short side of a probe pins stored therein is substantially circular.

The movable pin 20 has a larger widthwise dimension than its dimension along the thickness when viewing a cross section along the short side of the probe pin 10 as illustrated in FIG. 6 and FIG. 7. Therefore, when the conduction-path forming element 30 is widthwise for instance, this creates in large dead space along the thickness when a probe pin 10 that is circular in cross-section is housed in the receptacle 3. The probe pin 10 in the first embodiment of the inspection unit 1 is configured so that the conduction-path forming element 30 overlaps the movable pin 20 along the thickness thereof; therefore, none of the previously mentioned dead spaces are formed when the probe pin 10 is stored in a receptacle 3. Thus, it is possible to reduce the pitch within an array of probe pins.

Figure 8:
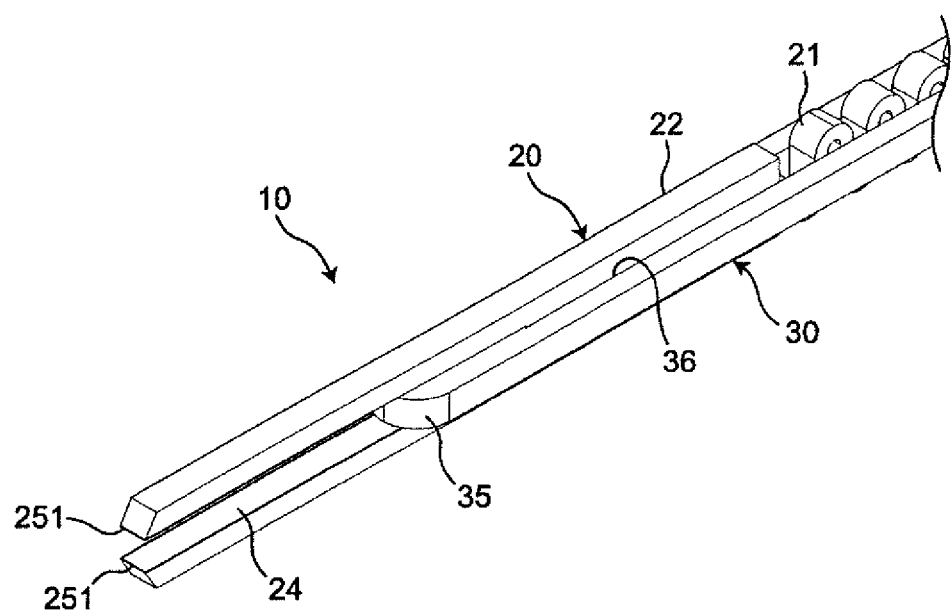
FIG. 8 is a partial exploded view illustrating another example of a conduction-path forming element in the probe pin shown in FIG. 2.
Figure 9:
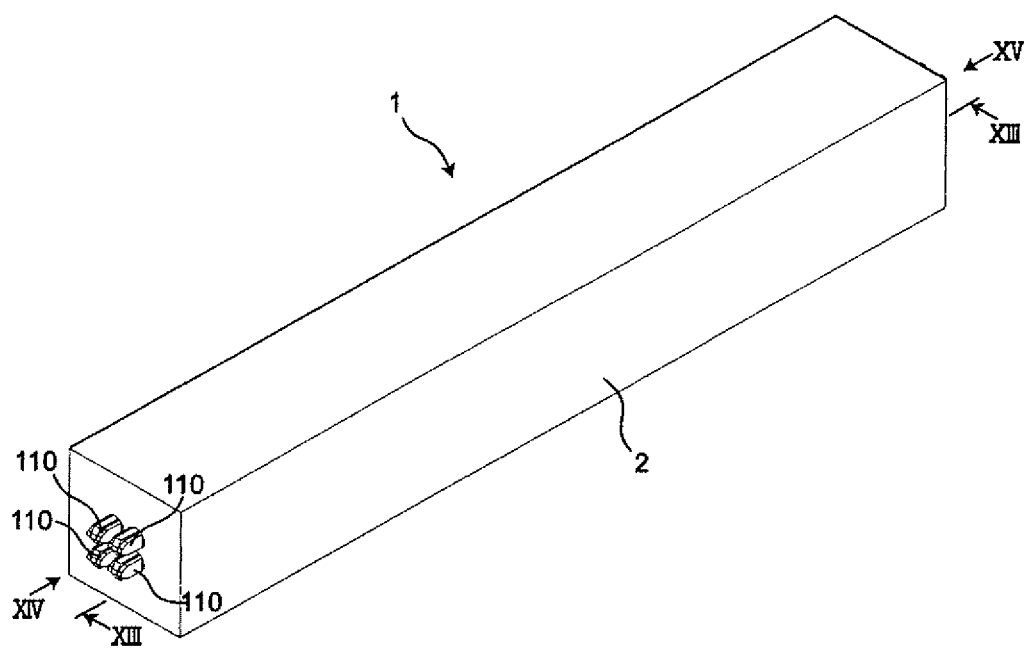
FIG. 9 is a perspective view of an inspection unit provided with a probe pin according to a second embodiment of the present invention.
Figure 10:
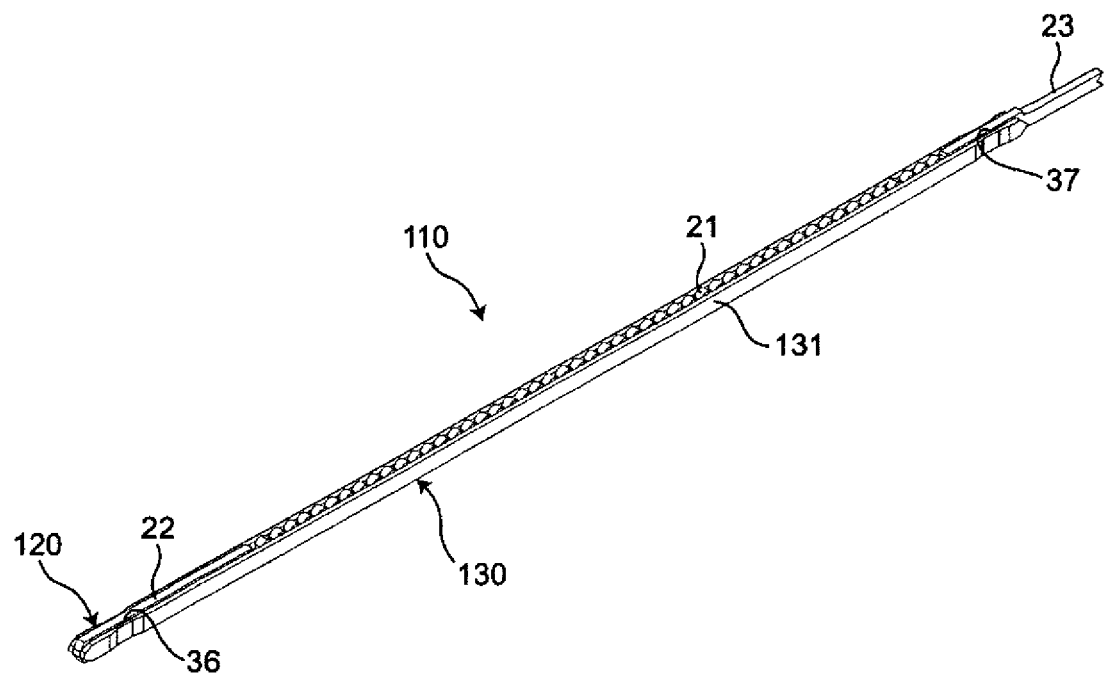
FIG. 10 is a perspective view of a probe pin according to a second embodiment of the present invention.

The guide hole 24 in the first contact part 22 of the movable pin 20 is not limited to extending from the middle part of the first contact part 22 lengthwise to near the first contact 251. The guide hole 24 may extend from the middle part of the first contact part 22 lengthwise up to the first contact 251 as illustrated in FIG. 8. The guide hole 24, thusly configured, facilitates assembly of the movable pin 20 and the conduction-path forming element 30, and improves the ease of assembling the probe pin 10.

The conduction-path forming element 30 is also not limited to being made up of the pair of feet 31, 32. For example, any one in the pair of feet 31, 32 may be excluded.

The receptacles 3 in the inspection unit 1 may be any desired shape and construction, as long as the receptacles 3 store the probe pins 10 with the first contact 251 and the second contact 252, i.e., a part of the first contact part 22 and a part of the second contact part 23 of the movable pin 20, outside the receptacle 3. The receptacles 3 should also allow the movable pin 20 and the conduction-path forming element 30 to move relatively lengthwise.

Second Embodiment

Figure 11:
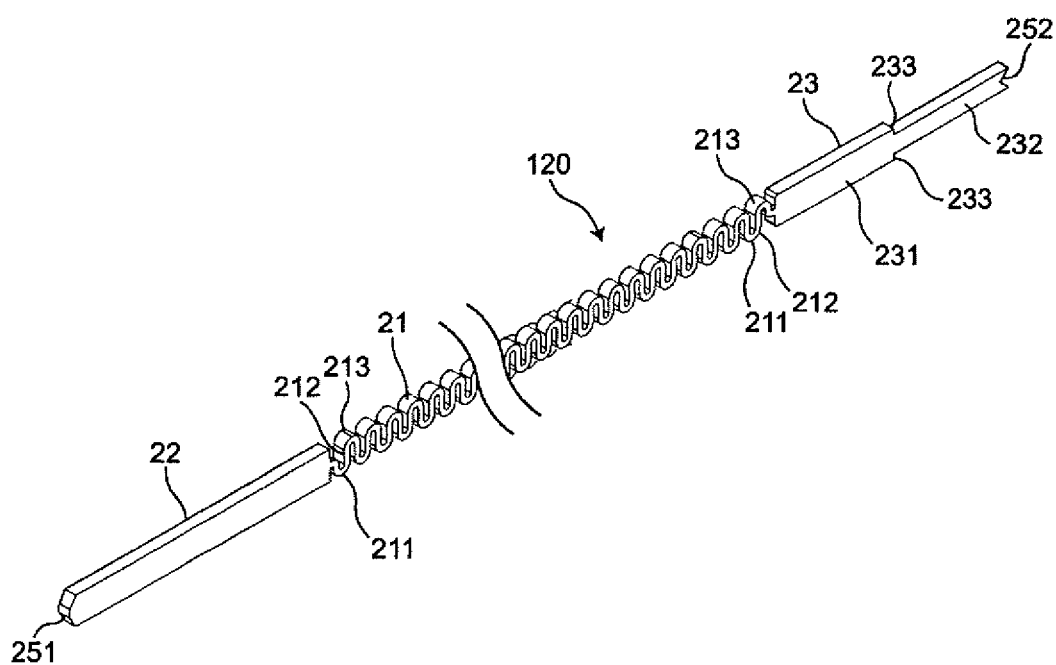
FIG. 11 is a perspective view of a movable pin in the probe pin shown in FIG. 10.

A probe pin 110 according the second embodiment is provided with a flat movable pin 120, and a conduction-path forming element 130 overlapping the movable pin 120 along the thickness thereof as illustrated in FIG. 9 through FIG. 15. There is no guide hole in the first contact part 22 of the movable pin 120, and the flat conduction-path forming element 130 extends along the length of the probe pin 110. The components in the second embodiment that are identical to the components in the first embodiment are given the same reference numerals and descriptions thereof are omitted; the features that are different from the first embodiment are described. In FIG. 11, a portion of the middle part of the flexible part 21 is omitted, and in FIG. 12, a portion of the middle part of the conduction-path forming element 130 is omitted.

Figure 12:
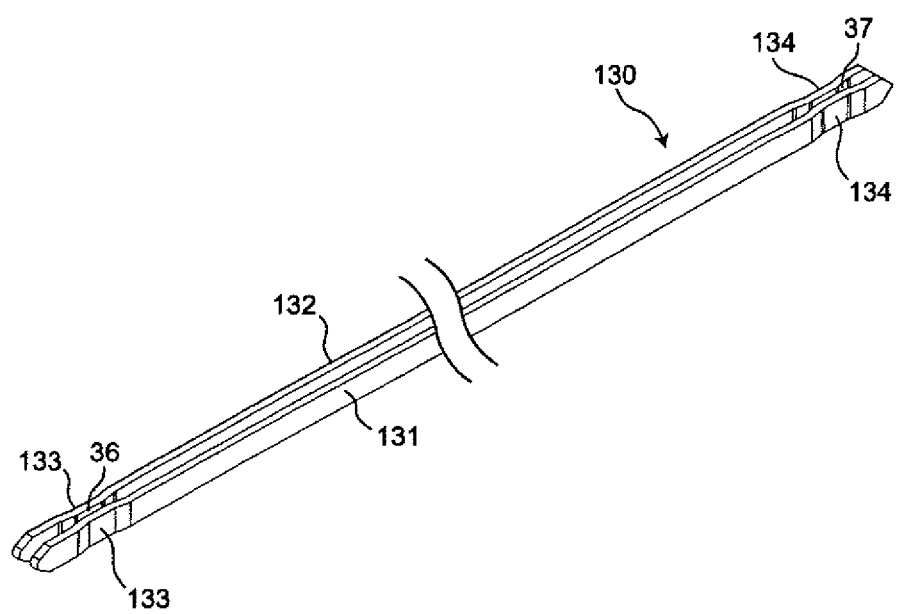
FIG. 12 is a perspective view of a conduction-path forming element in the probe pin shown in FIG. 10.
Figure 13:
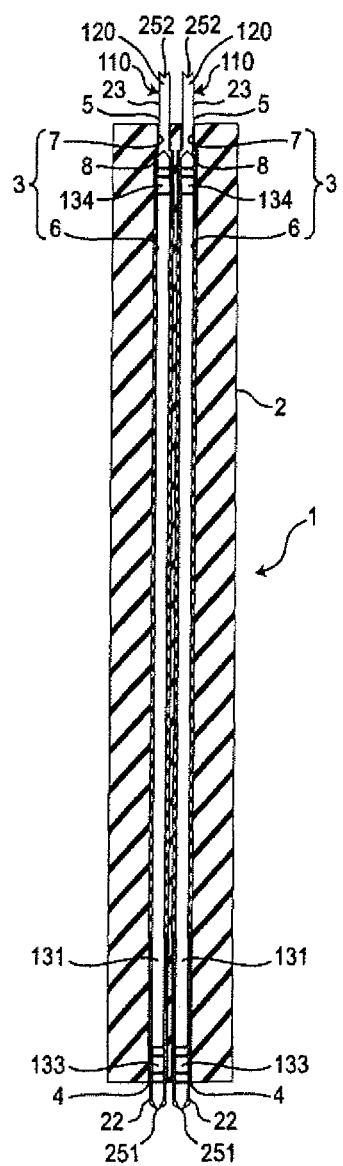
FIG. 13 is a cross-sectional view along the line XIII-XIII and FIG. 9.
Figure 14:
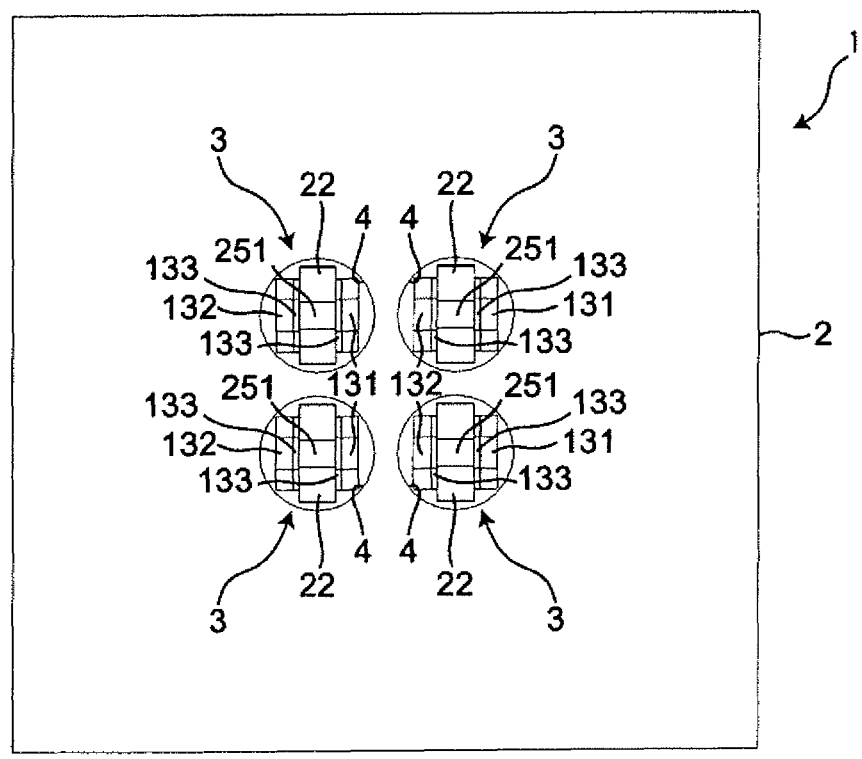
FIG. 14 is a view of the inspection unit shown in FIG. 9 along the arrow XIV.
Figure 15:
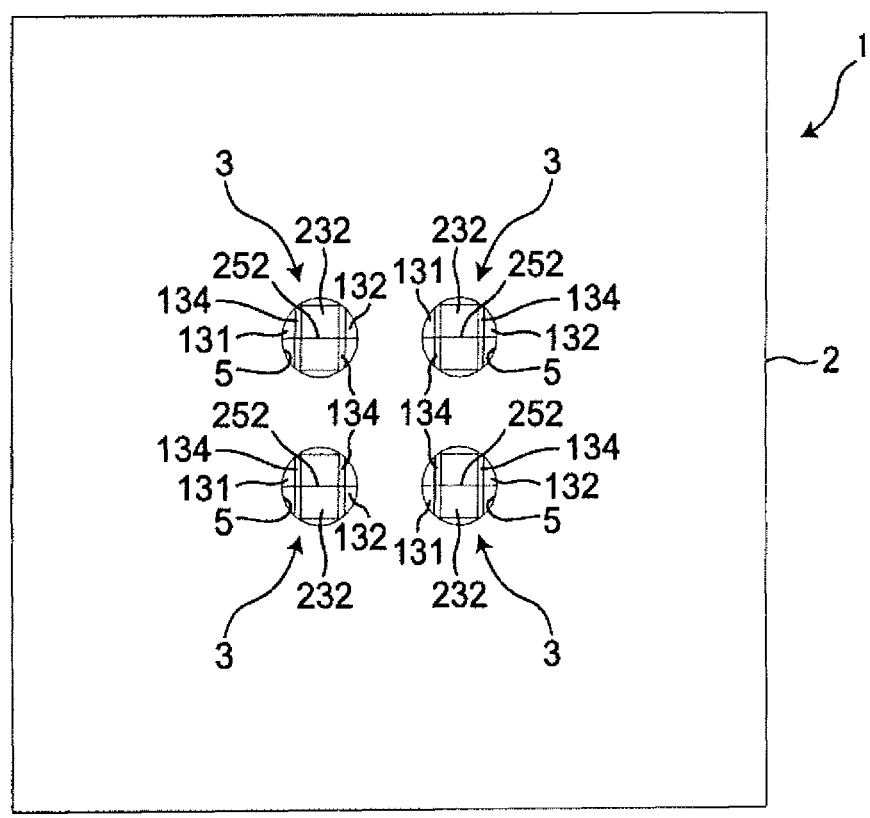
FIG. 15 is a view of the inspection unit shown in FIG. 9 along the arrow XV.
Figure 16:
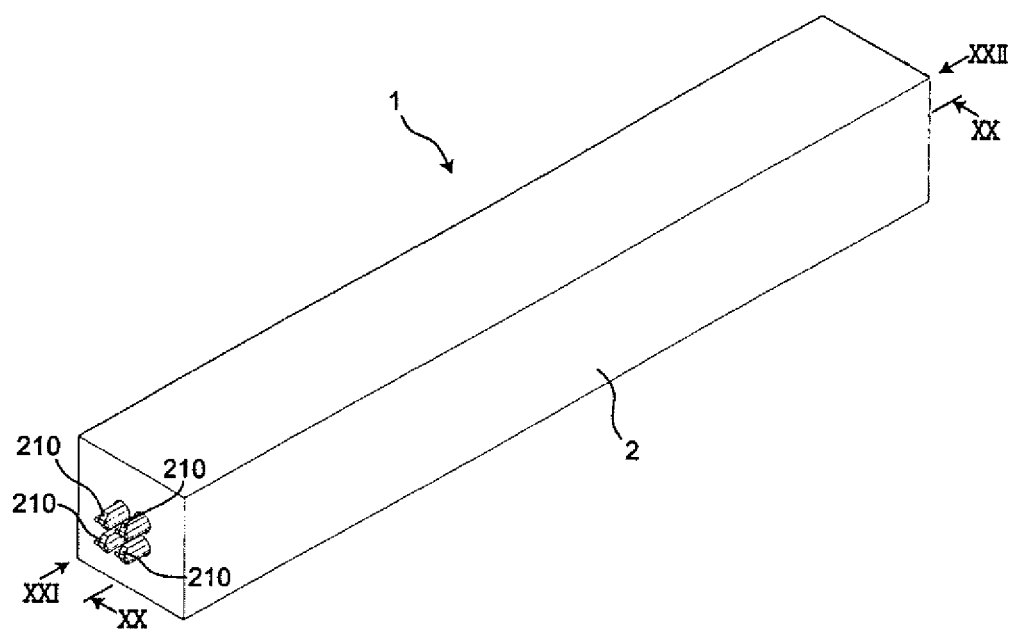
FIG. 16 is a perspective view of an inspection unit provided with a probe pin according to a third embodiment of the present invention.
Figure 17:
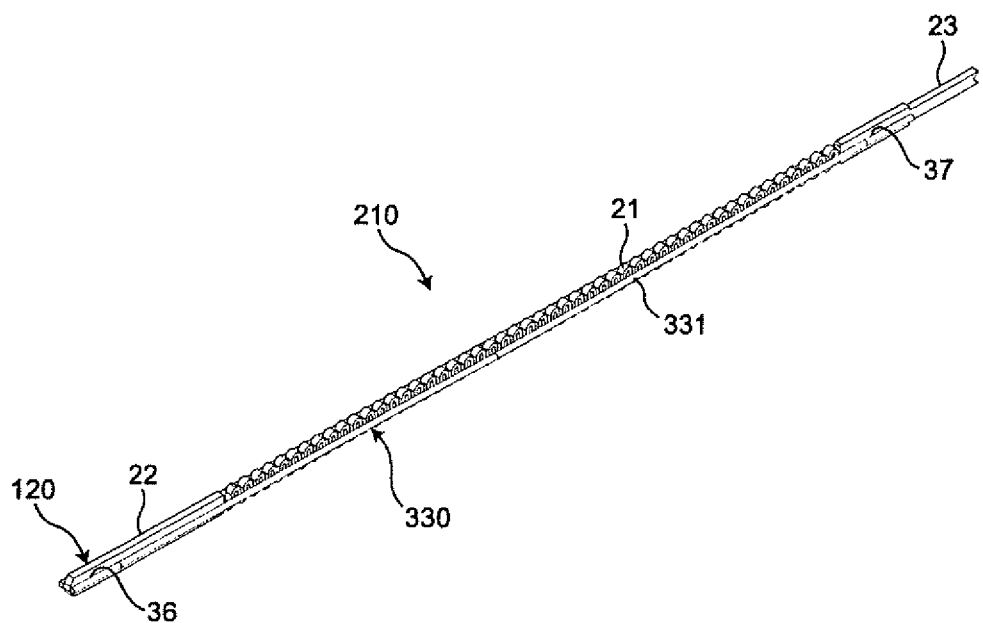
FIG. 17 is a perspective view of a probe pin according to a third embodiment of the present invention.

The conduction-path forming element 130 is made up of a pair of flat, oblong and mutually independent laminates 131, 132 of identical shape as illustrated in FIG. 12. The short-side dimension of the oblong laminates 131, 132 is less than widthwise dimension of the movable pin 120 (i.e., the widthwise dimension of the flexible part 21, the first contact part 22, and the width expander part 231 of the second contact part 23) when viewed from the thickness direction of the movable pin 120 as illustrated in FIG. 13. Protruding portions 133, 134 are provided, each extending toward the surface of the movable pin 120 at the ends of the oblong laminates 131, 132 lengthwise. The surface of the protruding portions 133 at the one end of the oblong laminates 131, 132 facing the first contact part 22 of the movable pin 120 constitutes a first contact surface 36; and the surface of the protruding portions 134 at the other end of the oblong laminates 131, 132 facing the second contact part 23 constitutes the second contact surface 37.

Thus, in the probe pin 110 of the second embodiment, the plate-like conduction-path forming element 130 extends lengthwise; the protruding portions 133, 134 are each provided at the ends of the probe pin 110 lengthwise; and the protruding portions 133, 134 extend toward the movable pin 120. Therefore, the size of the probe pin 10 can be reduced via a simple configuration.

The conduction-path forming element 130 is not limited to being made up of a pair of oblong laminates 131, 132; for example, any one in the pair of oblong laminates 131, 132 may be excluded.

Third Embodiment

The third embodiment differs from the second embodiment in that the probe pin 210 of the third embodiment is provided with a rod-like conduction-path forming element 330 extending along the length thereof as illustrated in FIG. 16 through FIG. 21. The components in the third embodiment that are identical to the components in the first and second embodiments are given the same reference numerals and descriptions thereof are omitted; the features that are different from the first and second embodiments are described.

Figure 18:
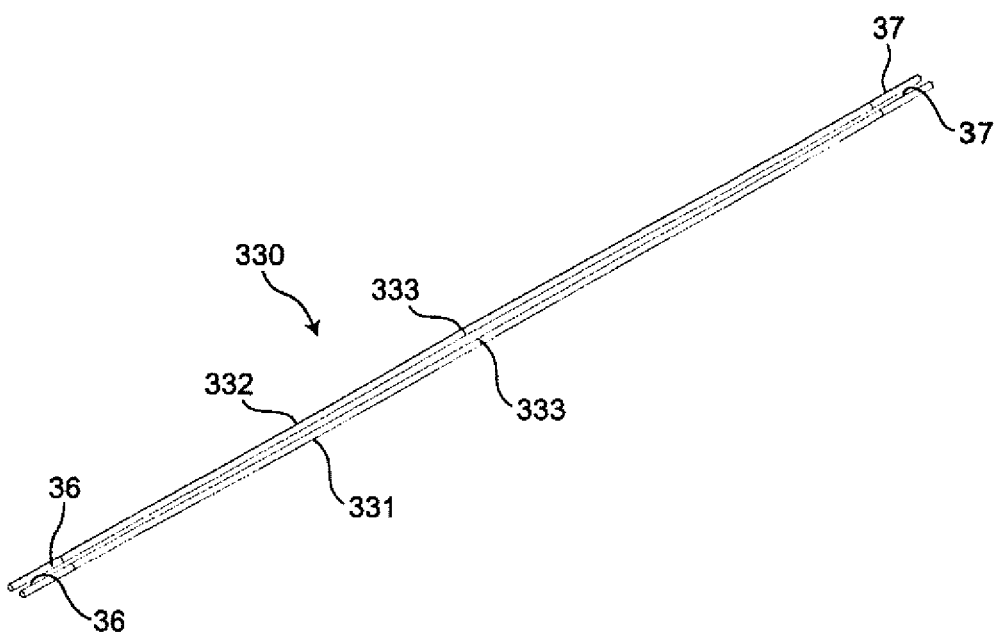
FIG. 18 is a perspective view of a conduction-path forming element in the probe pin shown in FIG. 17.
Figure 19:
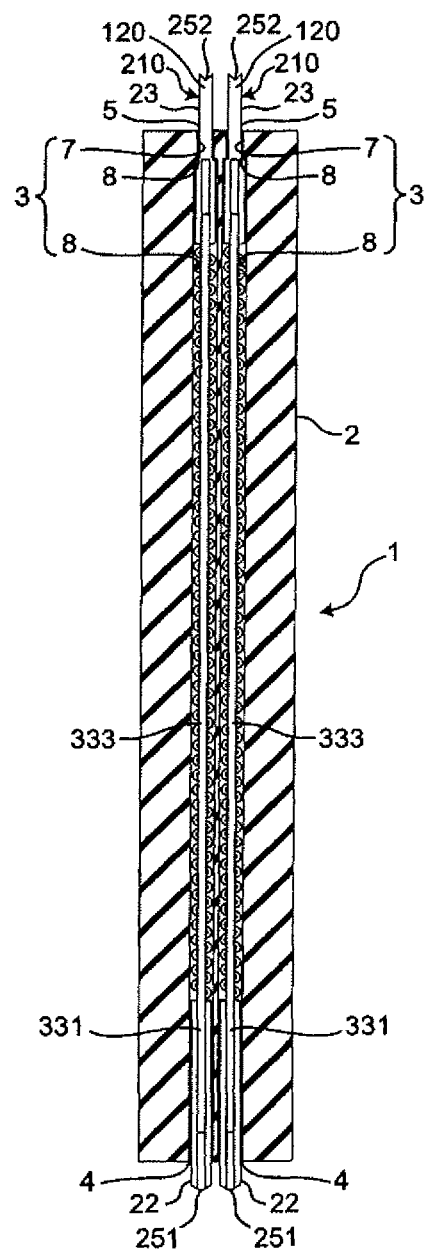
FIG. 19 is a cross-sectional view along the line XX-XX and FIG. 16.
Figure 20:
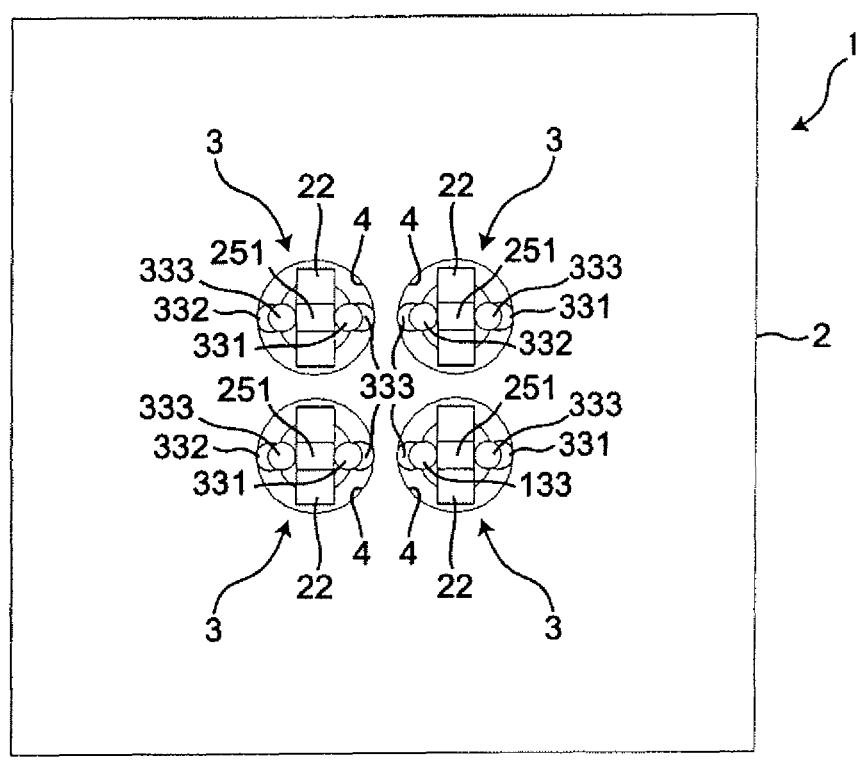
FIG. 20 is a view of the inspection unit shown in FIG. 16 along the arrow XXI.
Figure 21:
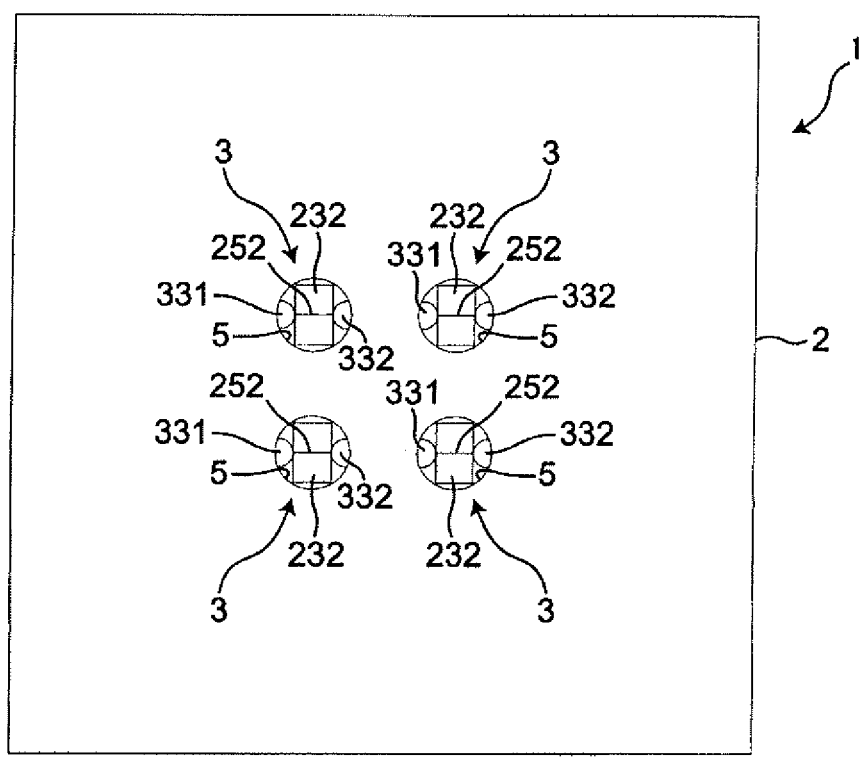
FIG. 21 is a view of the inspection unit shown in FIG. 16 along the arrow XXII.

The conduction-path forming element 330 is made up of a pair of oblong and mutually independent rods 331, 332 of identical shape as illustrated in FIG. 18. The short-side dimension of the oblong rods 331, 332 is less than widthwise dimension of the movable pin 120 (i.e., the widthwise dimension of the flexible part 21, the first contact part 22, and the width expander part 231 of the second contact part 23) when viewed from the thickness direction of the movable pin 120 as illustrated in FIG. 19. The oblong rods 331, 332 include a first contact surface 36 and a second contact surface 37 at one end of the oblong rods 331, 332 lengthwise, and configured to contact the first contact part 22 and the second contact part 23 respectively. The middle part 333 of the conduction-path forming element 330 curves away from the movable pin 120 as illustrated in FIG. 20.

The conduction-path forming element 330 in the probe pin 210 of the third embodiment is thus a rod-like element extending lengthwise. Therefore, the size of the probe pin 210 can be reduced via a simple configuration. The middle part 333 of the conduction-path forming element 330 also curves away from the movable pin 120; therefore, it is possible to improve the contact pressure between the conduction-path forming element 330 and the movable pin 120 when the probe pins 210 are stored in the corresponding receptacles 3 of the inspection unit 1. Thus, this improves the reliability of the contact between the movable pin 120 and the conduction-path forming element 330.

The conduction-path forming element 330 is not limited to being made up of a pair of oblong rods 331, 332; for example, any one in the pair of oblong rods 331, 332 may be excluded.

Here ends the description of various working embodiments of the invention with reference to the drawings. Lastly, various other aspects of the present invention are described.

A probe pin according to a first embodiment of the present invention includes:

a plate-like movable pin including: a flexible part configured to expand and contract lengthwise; and a first contact part and a second contact part each provided at an end of the flexible part lengthwise; and a conduction-path forming element extending lengthwise and overlapping the movable pin along the thickness thereof and configured to electrically connect the first contact part and the second contact part to each other;

the conduction-path forming element including a first contact surface and a second contact surface at one end of the conduction-path forming element lengthwise, the first contact surface and second contact surface configured to contact the first contact part and the second contact part, respectively; wherein the movable pin and the conduction-path forming element are arranged to allow the first contact part to remain in contact with the first contact surface and the second contact part to remain in contact with the second contact surface while allowing relative movement of the movable pin and the conduction-path forming element lengthwise.

A probe pin according to the aforementioned aspect is provided with a plate-like movable pin, and a conduction-path forming element overlapping the movable pin along the thickness thereof. Thus, the widthwise dimension of the movable pin determines the widthwise dimension of the probe pin; therefore, it is possible to reduce the size of the probe pin widthwise. This also makes it possible to reduce the pitch within an array of the probe pins even when a plurality of probe pins is arranged in the width direction thereof.

In a probe pin according to a second embodiment of the present invention:

the movable pin is provided with a guide hole in the first contact part, the guide hole extending lengthwise and passing through the thickness direction of the movable pin; and the conduction-path forming element is provided with a guide part at the end near the first contact surface, the guide part positioned in the guide hole and configured to move along the extension direction of the guide hole.

The probe pin according to the second embodiment is configured such that the guide part engages with the guide hole and moves smoothly along in the extension direction of the guide hole; therefore, the movable pin and the conduction-path forming element may move relative each other without obstruction.

In a probe pin according to a third embodiment of the present invention:

the conduction-path forming element is constituted by a pair of feet configured to warp mutually outward;

a pair of the protruding portions is provided extending toward each other at one end of the pair of feet lengthwise and constitutes the second contact surface; and a guide part is provided at the other end of the pair of feet lengthwise and connects the pair of feet;

the pair of protruding portions configured to clamp the second contact part of the movable pin while allowing the second contact part to move.

The pair of protruding portions in the third embodiment of the probe pin ensures that contact with the second contact part in the movable pin remains stable while the movable pin moves; this increases the contact reliability between the movable pin and the conduction-path forming element.

In a probe pin according to a fourth embodiment of the present invention:

the conduction-path forming element is plate-like and extends lengthwise with protruding portions each provided at one end of the conduction-path forming element lengthwise, the protruding portions each extending toward the movable pin and accommodating the first contact surface and the second contact surface thereon respectively.

The probe pin according to the fourth embodiment allows the size of the probe pin to be reduced via a simple configuration.

In a probe pin according to a fifth embodiment of the present invention:

the conduction-path forming element is a rod extending lengthwise, and the middle part curves away from the movable pin.

The probe pin according to the fifth embodiment allows the size of the probe pin to be reduced via a simple configuration.

A probe pin according to a sixth embodiment of the present invention includes:

a plurality of the aforementioned probe pins; and a housing; the housing including a plurality of receptacles configured to store the probe pins with a portion of the first contact part and a portion of the second contact part outside the housing, and to support the movable pin and the conduction-path forming element, allowing the movable pin and the conduction-path forming element to move relatively lengthwise.

An inspection unit according to the sixth embodiment also makes it possible to reduce the pitch within an array of a plurality of the aforementioned probe pins.

Note that the various above-described embodiments and modification examples may be combined as appropriate to obtain the results thereof. Additionally, the embodiments, working examples, or embodiments and example modifications may be combined; however, different embodiments and working examples with similar features may also be combined.

While preferred embodiments of the present invention are described herein with reference to the drawings, the variations and modifications thereto are also obvious to a person skilled in the art. Such variations and modifications should be understood to fall within the technical scope of the invention as described in the claims.

INDUSTRIAL APPLICABILITY

A probe pin according to the present invention may be adopted in an inspection unit used to inspect a camera or a liquid crystal panel, for example.

The invention claimed is:

1. A probe pin comprising:
a plate-like movable pin including: a flexible part configured to expand and contract lengthwise; and a first contact part and a second contact part each provided at an end of the flexible part lengthwise; and
a conduction-path forming element extending lengthwise and overlapping the movable pin along the thickness thereof and configured to electrically connect the first contact part and the second contact part to each other;
the conduction-path forming element including a first contact surface and a second contact surface at one end of the conduction-path forming element lengthwise, the first contact surface and second contact surface configured to contact the first contact part and the second contact part, respectively; wherein
the movable pin and the conduction-path forming element are arranged to allow the first contact part to remain in contact with the first contact surface and the second contact part to remain in contact with the second contact surface while allowing relative movement of the movable pin and the conduction-path forming element lengthwise, the movable pin is provided with a guide hole in the first contact part, the guide hole extending lengthwise and passing through the thickness direction of the movable pin;

the conduction-path forming element is provided with a guide part at the end near the first contact surface, the guide part positioned in the guide hole and configured to move along the extension direction of the guide hole, the conduction-path forming element is constituted by a pair of feet configured to warp mutually outward, a pair of the protruding portions is provided extending toward each other at one end of the pair of feet lengthwise and constitutes the second contact surface; and a guide part is provided at the other end of the pair of feet lengthwise and connects the pair of feet, and the pair of protruding portions configured to clamp the second contact part of the movable pin while allowing the second contact part to move.

2. An inspection unit comprising:

a plurality of probe pins according to claim 1; and a housing; the housing including a plurality of receptacles configured to store the probe pins with a portion of the first contact part and a portion of the second contact part outside the housing, and to support the movable pin and the conduction-path forming element, allowing the movable pin and the conduction-path forming element to move relatively lengthwise.

* * * * *